(12) United States Patent
Chou et al.

(10) Patent No.: US 6,971,914 B1
(45) Date of Patent: Dec. 6, 2005

(54) ANTI-ELECTROMAGNETIC WAVE CASING FOR THE PHOTOELECTRIC CONVERTER

(76) Inventors: Yu-Te Chou, 23,R&D Road2,Science-Based Industrial Park, Hsin-Chu City (TW); Chien-Feng Yu, 23, R&D Road 2, Science-Based Industrial Park, Hsin-Chu City (TW)

( * ) Notice: Subject to any disclaimer, the term of this patent is extended or adjusted under 35 U.S.C. 154(b) by 0 days.

(21) Appl. No.: 10/844,770

(22) Filed: May 12, 2004

(51) Int. Cl.[7] .......................................... H01R 13/648
(52) U.S. Cl. .................................... 439/607; 174/35 R
(58) Field of Search ................................ 439/607, 608, 439/609; 174/51, 50.59, 35 R; 361/799, 361/800, 753

(56) References Cited

U.S. PATENT DOCUMENTS

| | | | |
|---|---|---|---|
| 5,434,747 A | * | 7/1995 | Shibata ........................ 439/607 |
| 6,530,785 B1 | * | 3/2003 | Hwang ....................... 439/76.1 |
| 6,762,940 B2 | * | 7/2004 | Zaremba ...................... 439/607 |

* cited by examiner

*Primary Examiner*—Ross Gushi
*Assistant Examiner*—Briggitte R. Hammond
(74) *Attorney, Agent, or Firm*—Birch, Stewart, Kolasch & Birch, LLP

(57) ABSTRACT

An anti-electromagnetic wave casing for the photoelectric converter includes two casings for photoelectric converter: 1. a front protruding casing and 2. a rear protruding casing. The casings are made of stainless steel and can be inserted to complete rapid assembly, providing features of convenient assembly, easy disassembly and multiple uses.

2 Claims, 12 Drawing Sheets

ANTI-ELECTROMAGNETIC WAVE CASING FOR THE PHOTOELECTRIC CONVERTER

1. FIELD OF THE INVENTION

The present invention relates to an anti-electromagnetic wave casing for the photoelectric converter, particularly to a structural improvement of the anti-electromagnetic wave casing for a photoelectric converter that enables speedy and convenient assembly or disassembly of the casing.

2. BACKGROUND OF THE INVENTION

The conventional photoelectric converter serves to conduct bi-directional data transmission between an electric interface and an optical fiber data network. The anti-electromagnetic wave casing is attached to the photoelectric converter by a welding process, which involves the following shortcomings:

(1) Laborious and time consuming
(2) Difficult to disassemble
(3) Increased costs

3. SUMMARY OF THE INVENTION

It is the objective of this invention to provide a structural improvement of "anti-electromagnetic wave casing for the photoelectric converter", comprising two types of U-shaped casing structures: 1. a front protruding casing that is fastened to the photoelectric converter; 2. a rear protruding casing that is fastened to the photoelectric converter. A combination of front protruding press plates is installed at the front of the front protruding casing, and a combination of rear protruding press plates is installed at the front of the rear protruding casing, and the front protruding press plates and the rear protruding press plates are used for fastening the photoelectric converter to the casings. snap plates are respectively installed at one end of two opposite sides of the front protruding casing and one end of two opposite sides of the rear protruding casing, and the snap plates are pressed and folded down so as to engage with or disengage from the photoelectric converter; the snap plates have the function of speedy closing and opening to enable a convenient assembling and disassembling process.

4. DESCRIPTION OF THE DRAWINGS

In order that the present invention may more readily be understood, the following description is given, merely by way of example with reference to the accompanying drawings, in which.

5. DESCRIPTION OF PREFERRED EMBODIMENT

Figure 1:
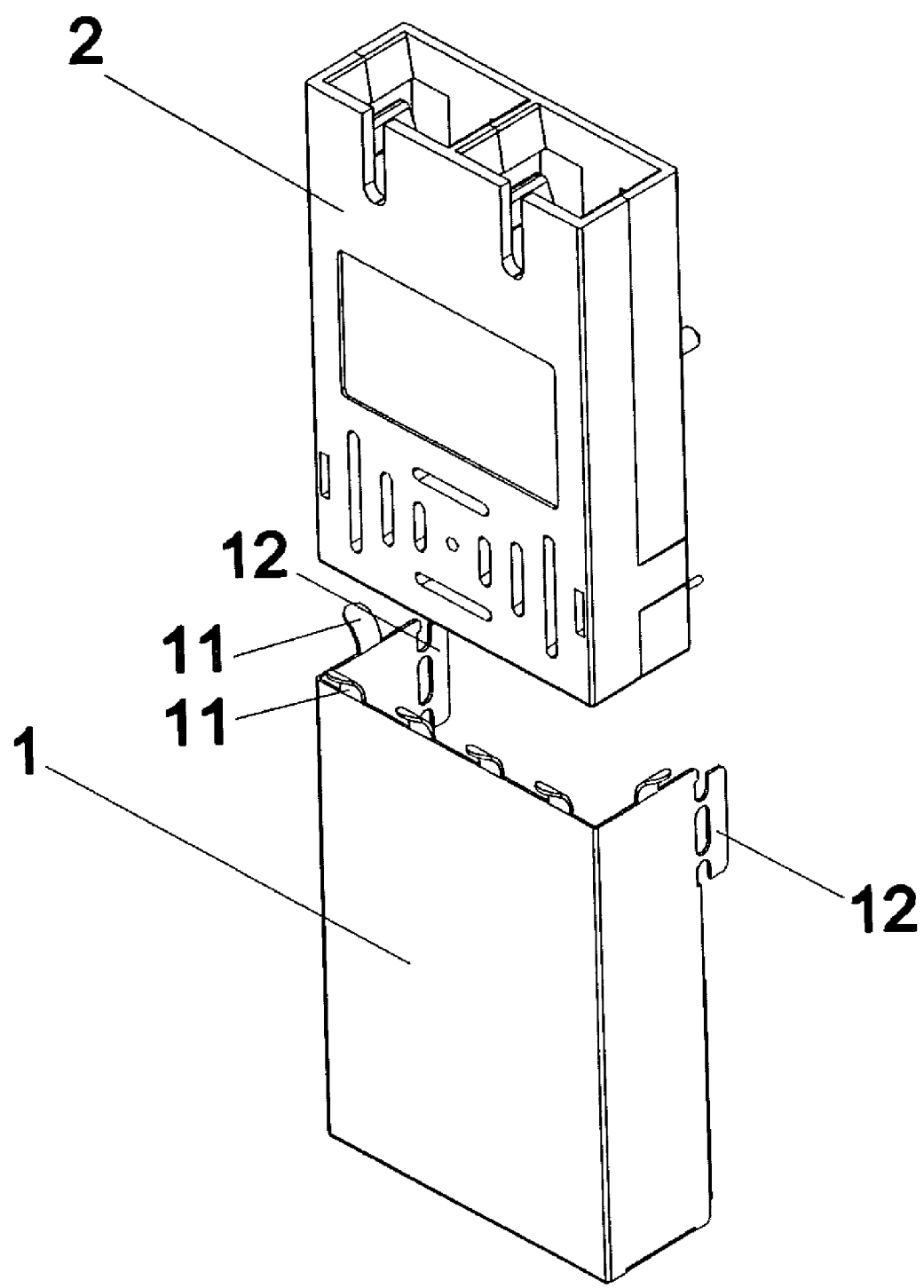
FIG. 1 is a top view of the invention when the front protruding casing is separated from the photoelectric converter.
Figure 2:
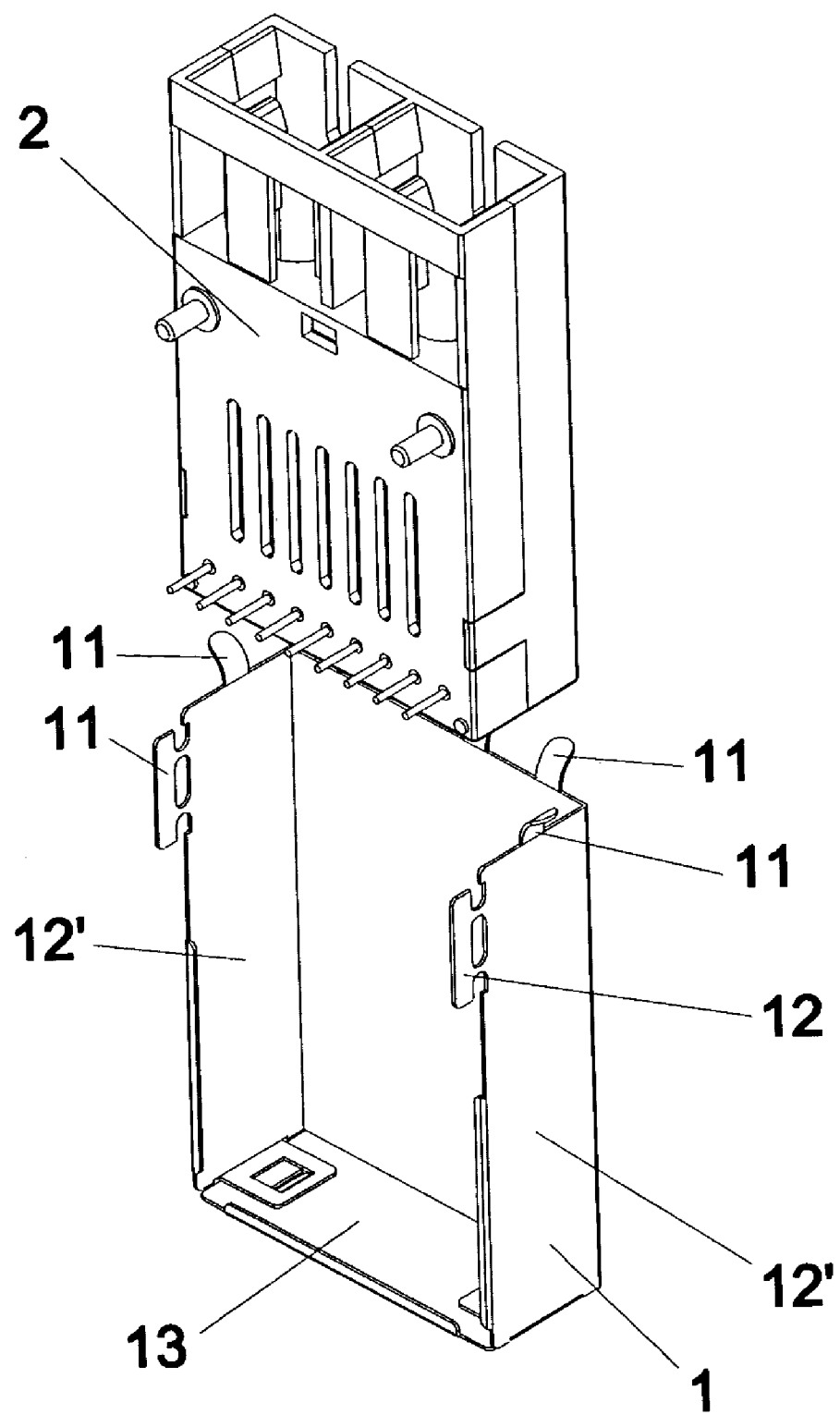
FIG. 2 is a bottom view of the invention when the front protruding casing is separated from the photoelectric converter.
Figure 3:
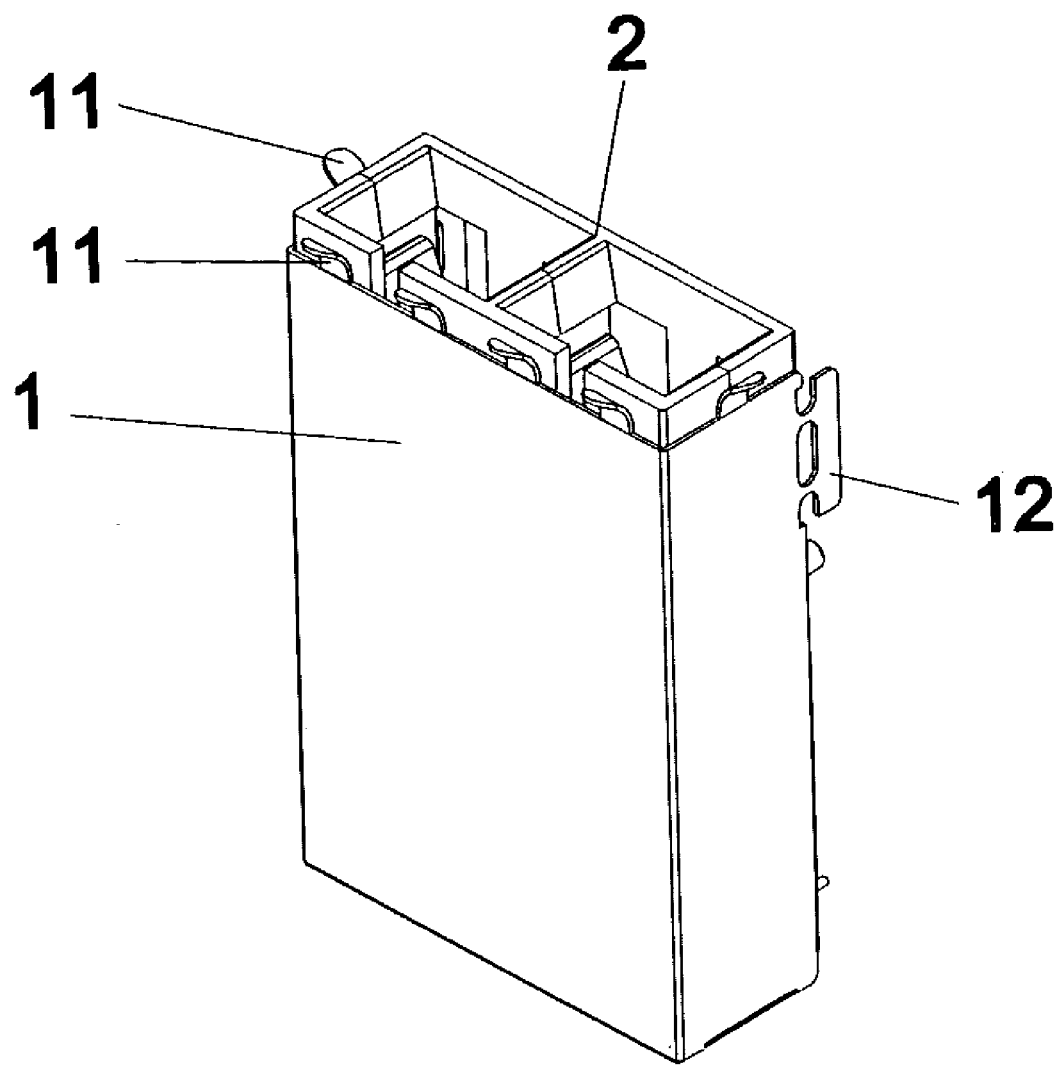
FIG. 3 is a top view of the invention when the front protruding casing is assembled to the photoelectric converter.
Figure 4:
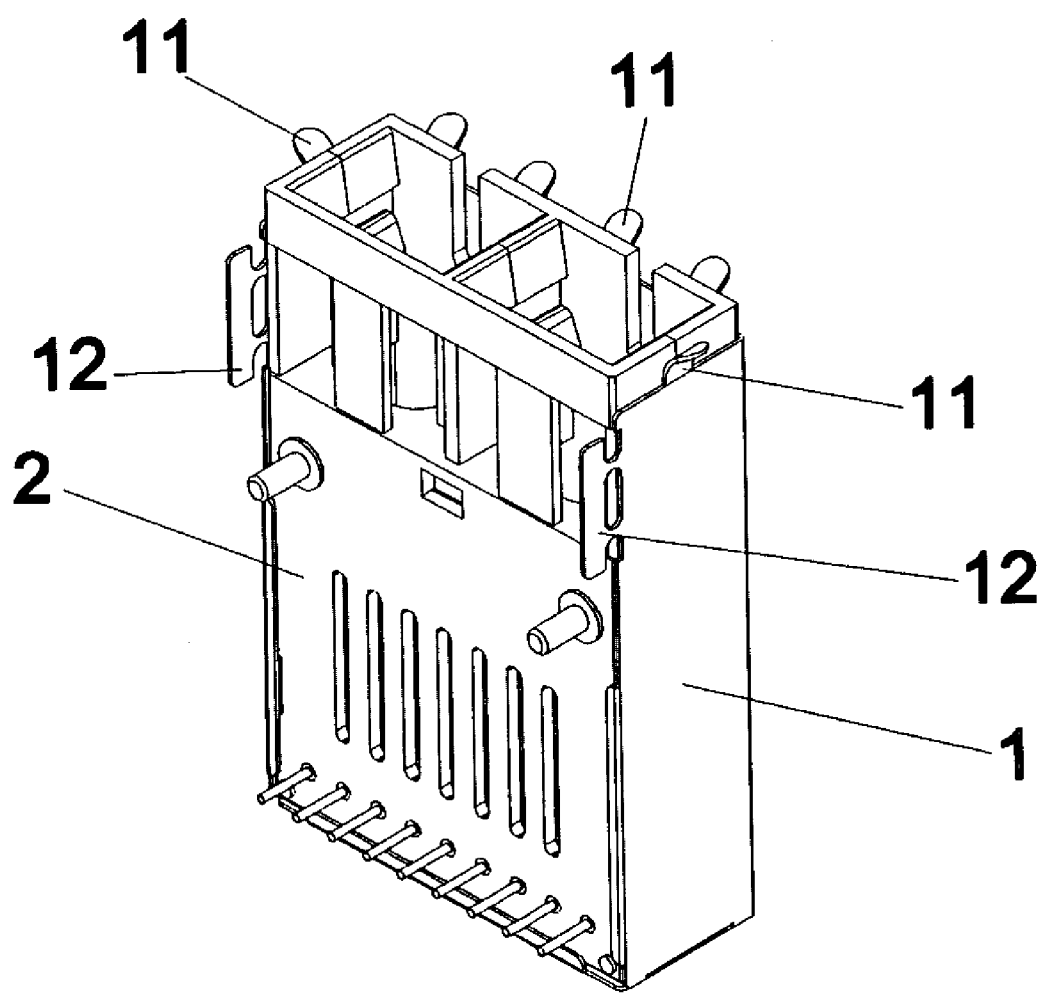
FIG. 4 is a bottom view of the invention when the front protruding casing is assembled to the photoelectric converter.
Figure 5:
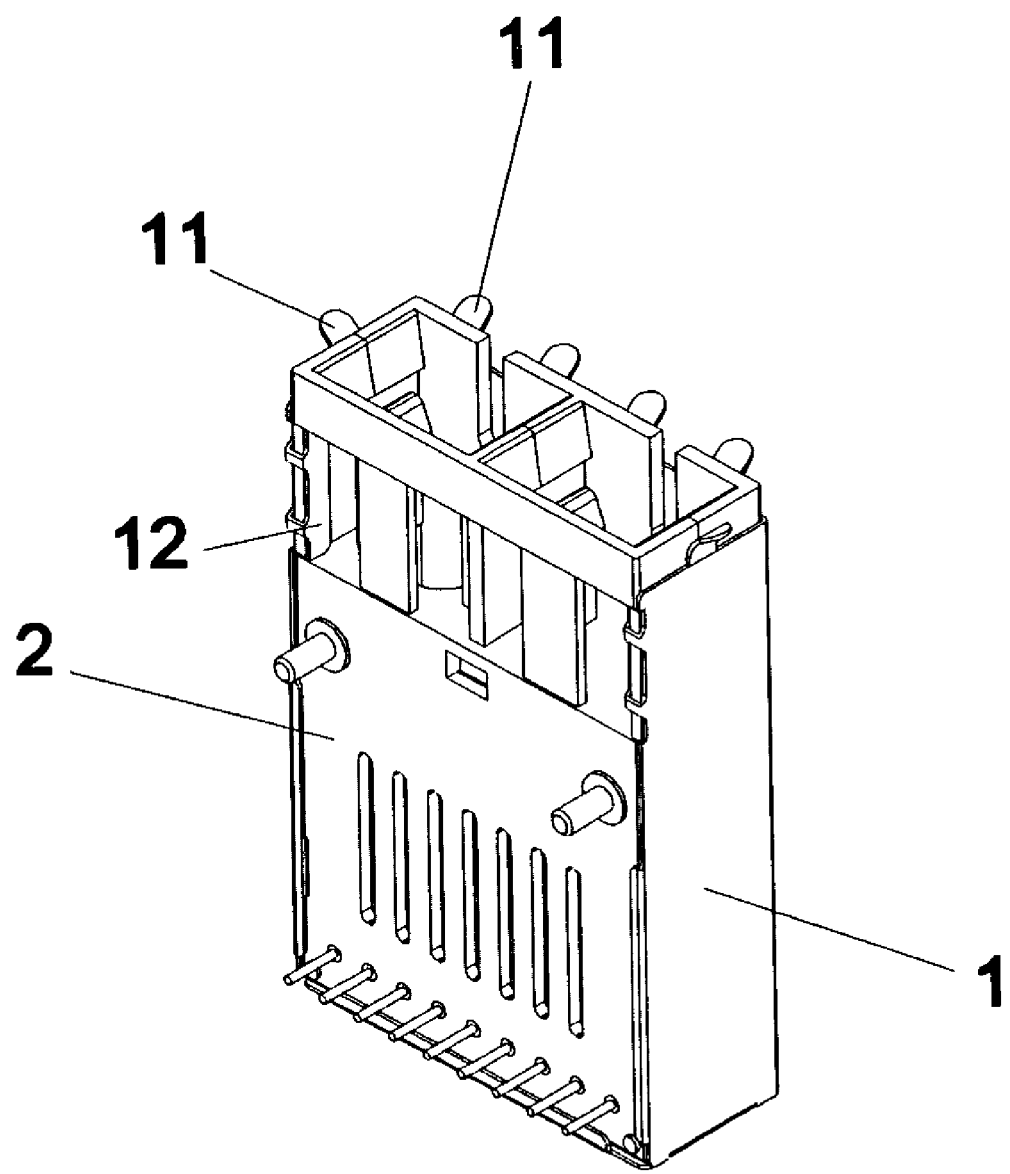
FIG. 5 is a bottom view of an embodiment of the invention when the front protruding casing is assembled to the photoelectric converter.
Figure 6:
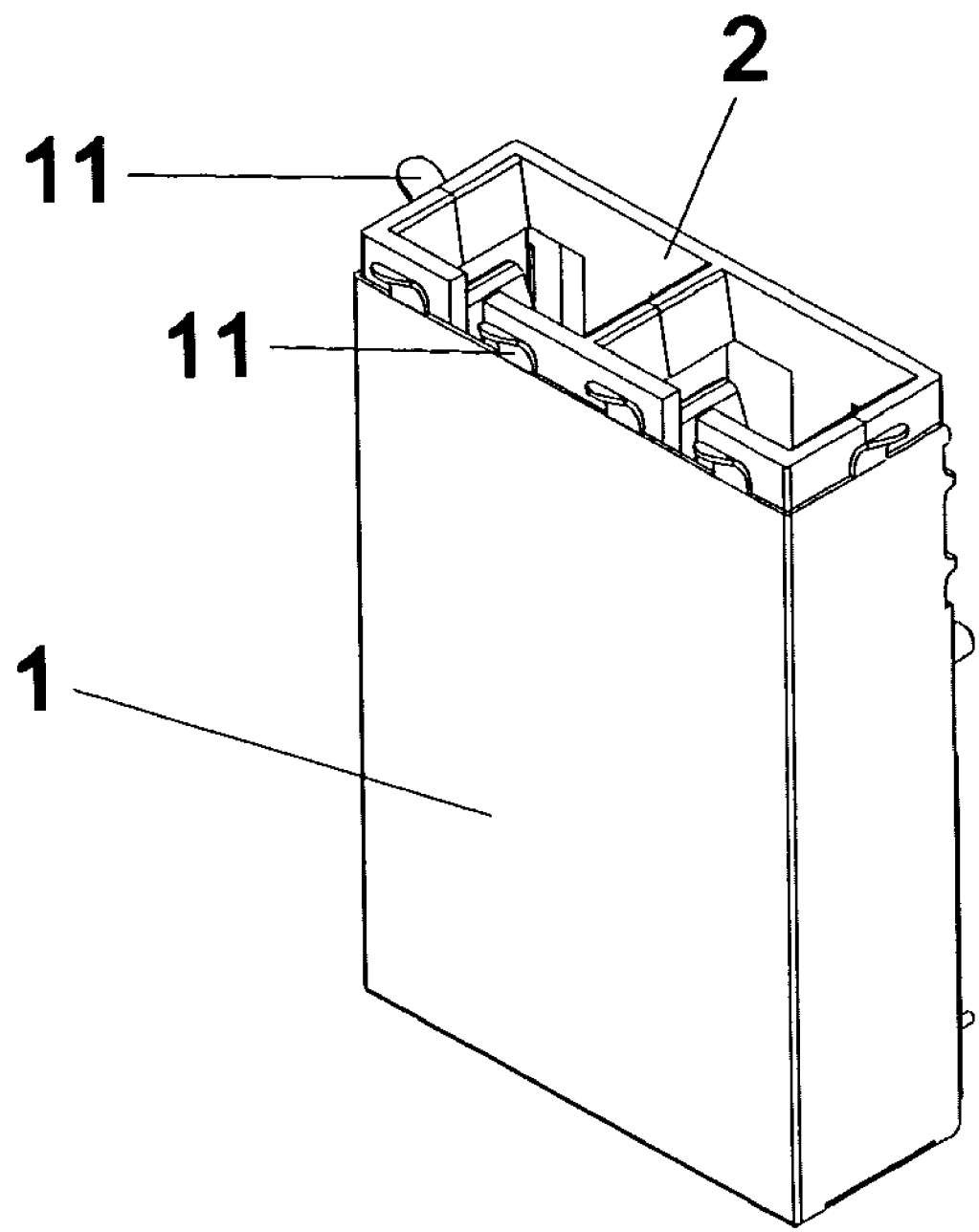
FIG. 6 is a top view of an embodiment of the invention when the front protruding casing is assembled to the photoelectric converter.

The present invention relates to a type of anti-electromagnetic wave casing for the photoelectric converter. Please refer to FIGS. 1–12, wherein a structural improvement is made on a casing of a photoelectric converter 2 (or 2'). The casing for the photoelectric converter 2 refers to a front protruding casing 1 shown in FIGS. 1–6, and that for the photoelectric converter 2' refers to a rear protruding casing 1' shown in FIGS. 7–12. The front protruding casing 1 is shaped like a "U" figure, and a combination of front protruding press plates 11 is installed at the lower side of one end of the U-shaped front protruding casing 1, and another two front protruding press plates 11 are respectively installed at two opposite sides of the U-shaped casing adjacent to the combination of front protruding press plates 11. Two snap plates 12 are respectively installed at the end of two opposite sides of the U-shaped front protruding casing 1 adjacent to the aforementioned another two front protruding press plates 11. The rear protruding press plates 11 described above protrude outwards and upwards from one end of the rear protruding casing 1. Two side faces 12' of the front protruding casing 1 are joined with a rear end face 13, as shown in FIGS. 1–6. Two snap plates 12 extend from the side faces 12 in the direction perpendicular to the rear end face 13, and all the rear protruding press plate 11 extend respectively out of the side faces 12 and the rear end face 13. Please refer to FIGS. 4 and 5, by pressing and folding the snap plate 12 down to the faces 12' of the front protruding casing 1, the front protruding casing 1 can be joined with the photoelectric converter 2. By pulling up the snap plate 12, the front protruding casing 1 can be disassembled from the photoelectric converter 2. FIG. 6 shows an embodiment when the front protruding casing 1 is assembled with the photoelectric converter 2.

Figure 7:
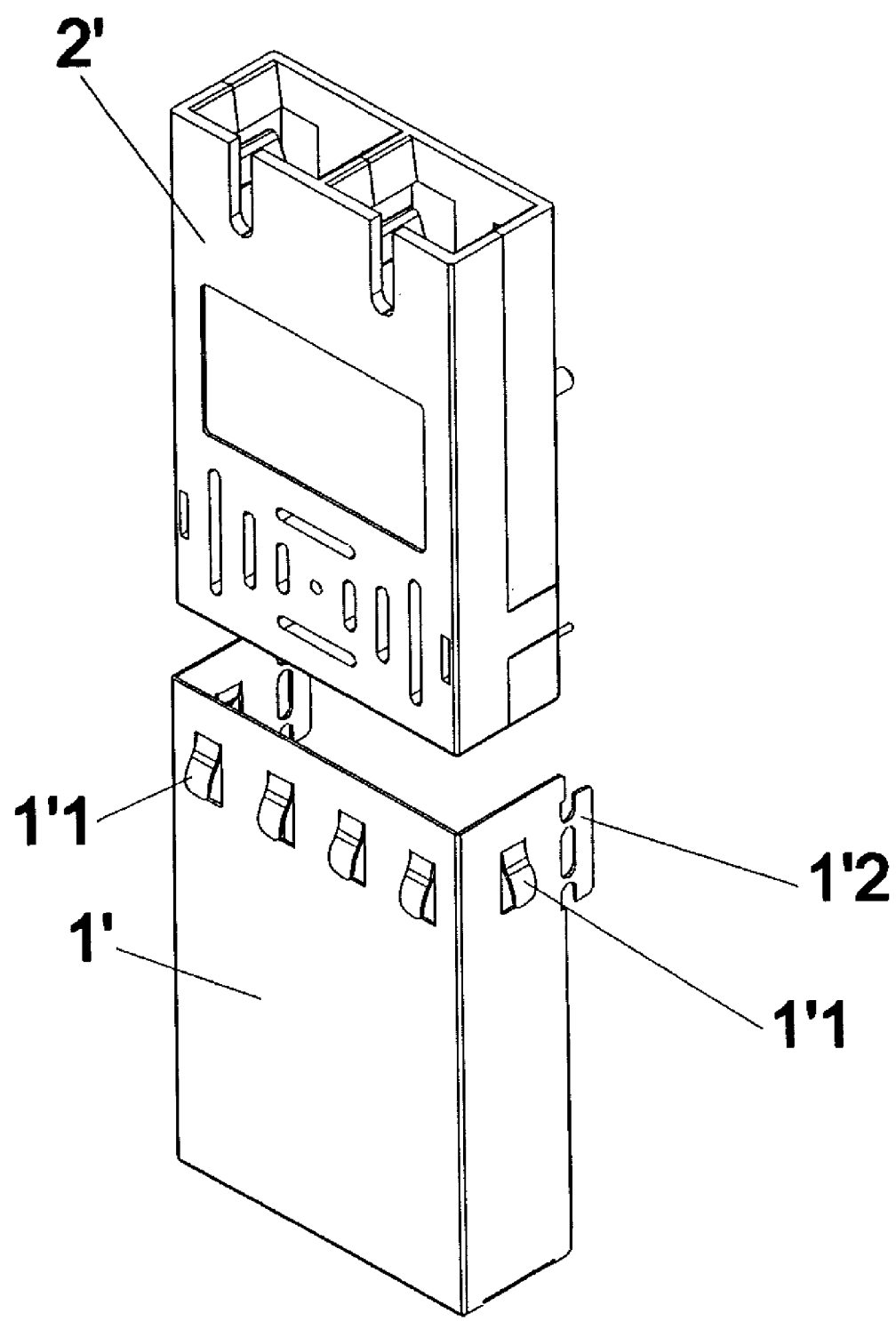
FIG. 7 is a top view of the invention when the rear, protruding casing is assembled to the photoelectric converter.
Figure 8:
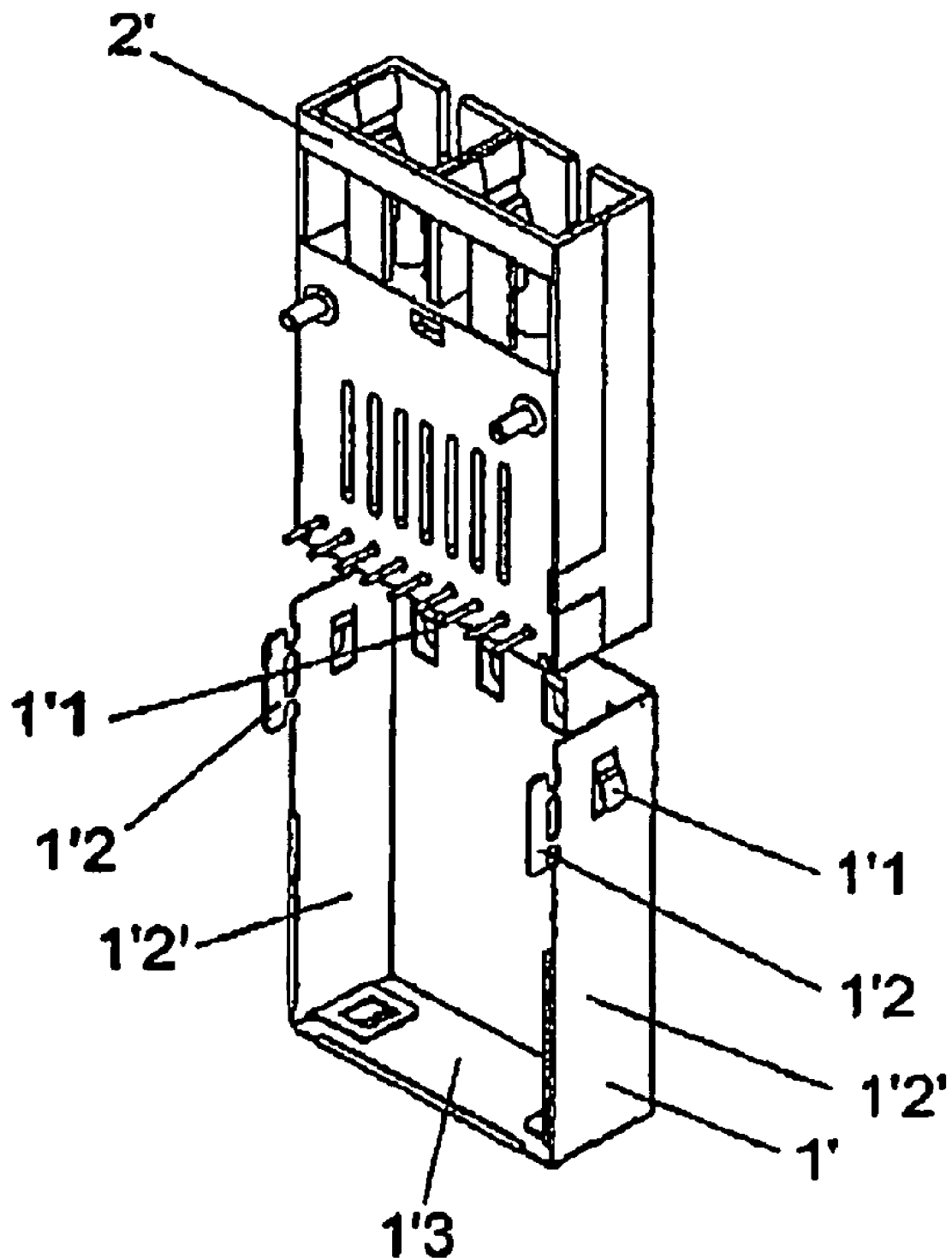
FIG. 8 is a bottom view of the invention when the rear, protruding casing is assembled to the photoelectric converter.
Figure 9:
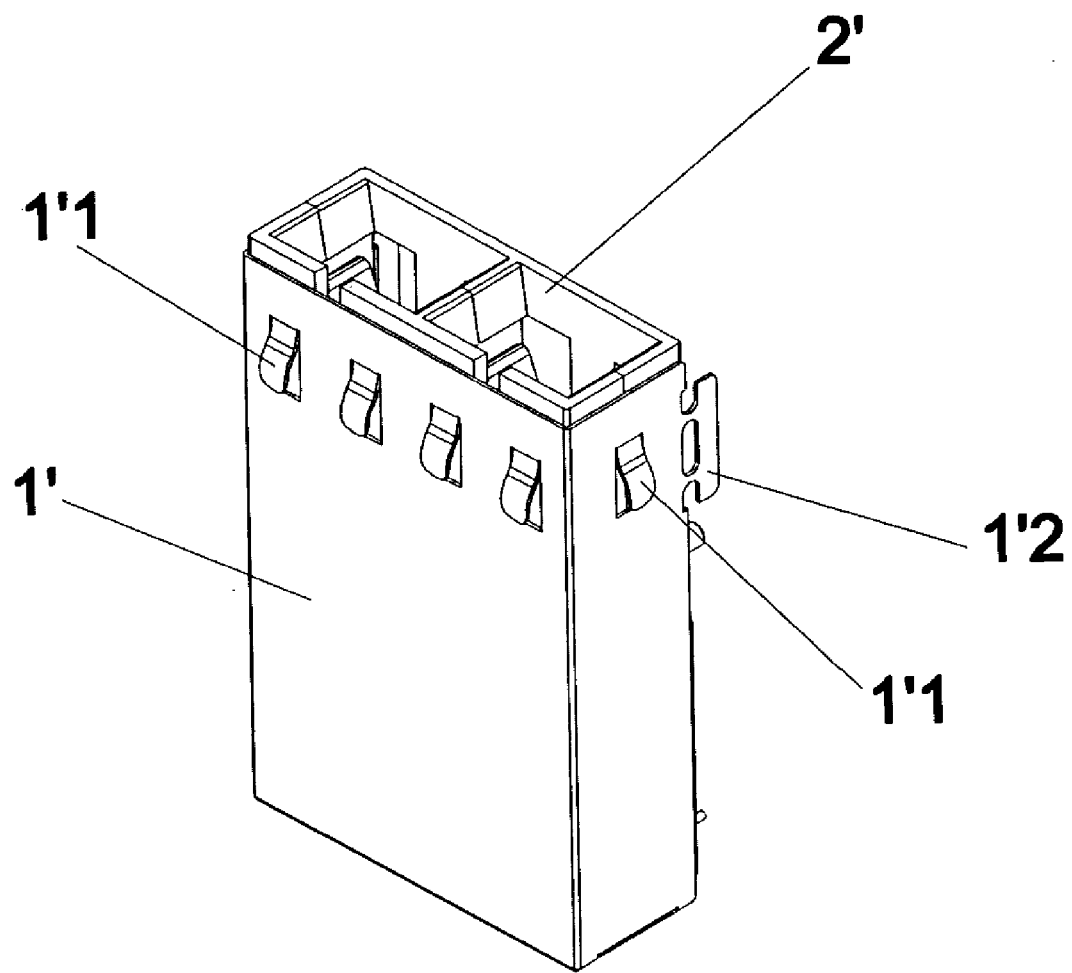
FIG. 9 is a top view of the invention when the rear, protruding casing is separated from the photoelectric converter.
Figure 10:
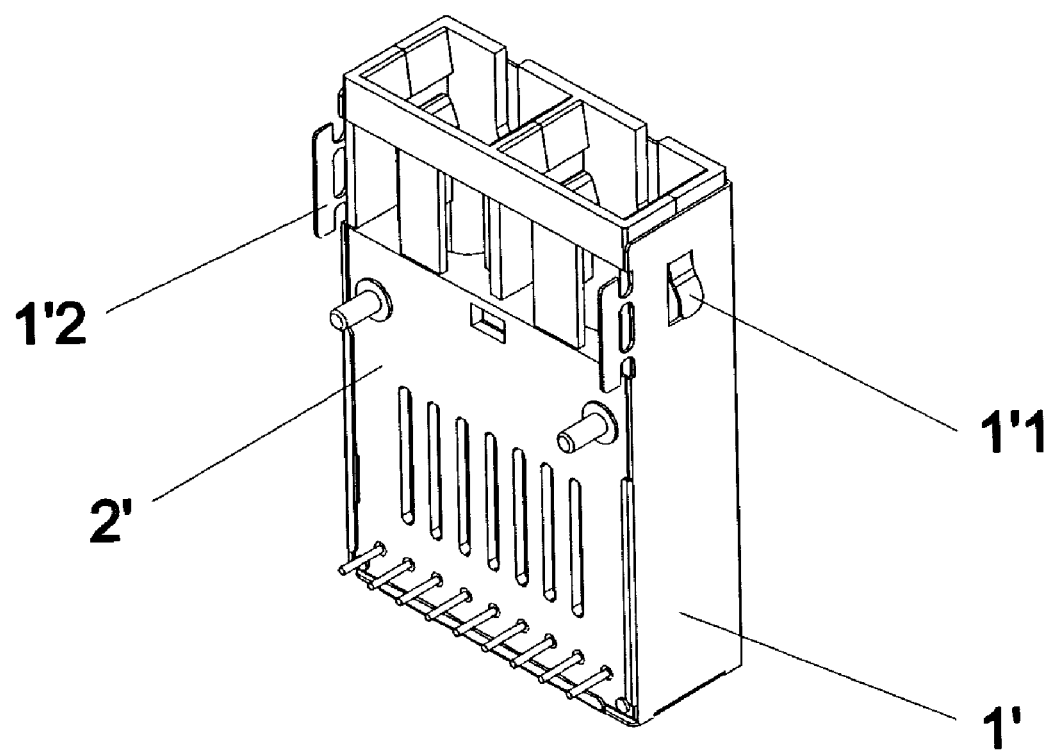
FIG. 10 is a bottom view of the invention when the rear, protruding casing is separated from the photoelectric converter.
Figure 11:
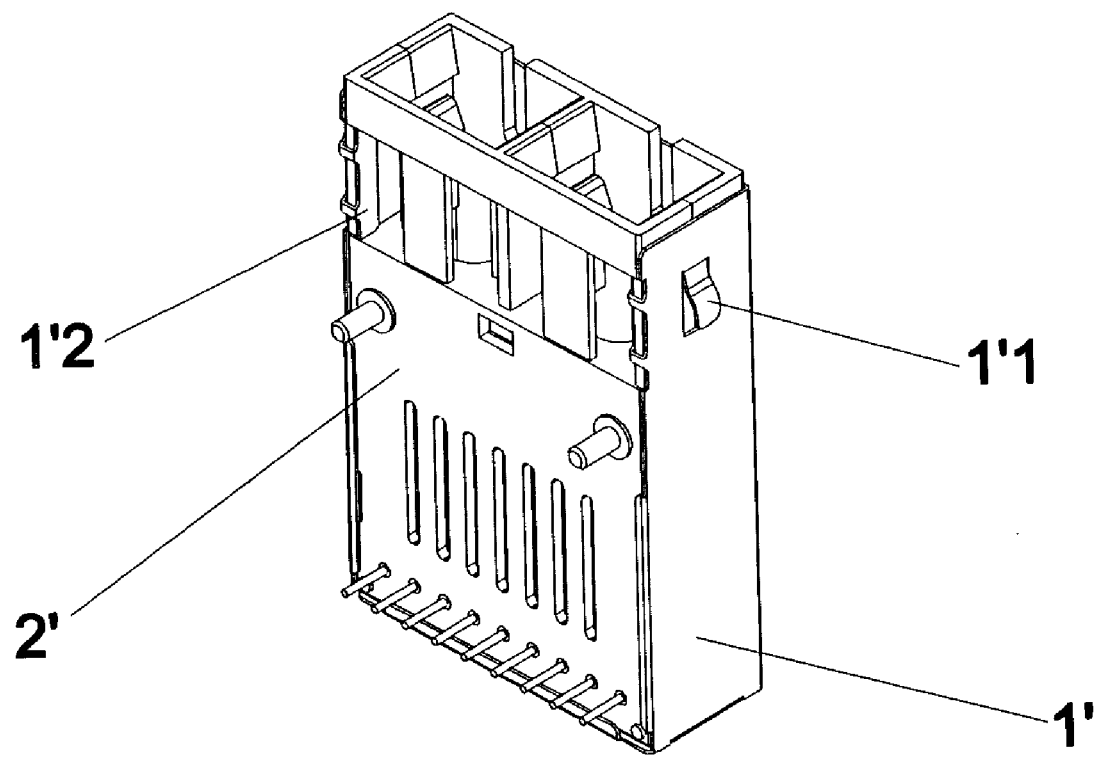
FIG. 11 is a bottom view of an embodiment of the invention when the rear, protruding casing is assembled to the photoelectric converter.
Figure 12:
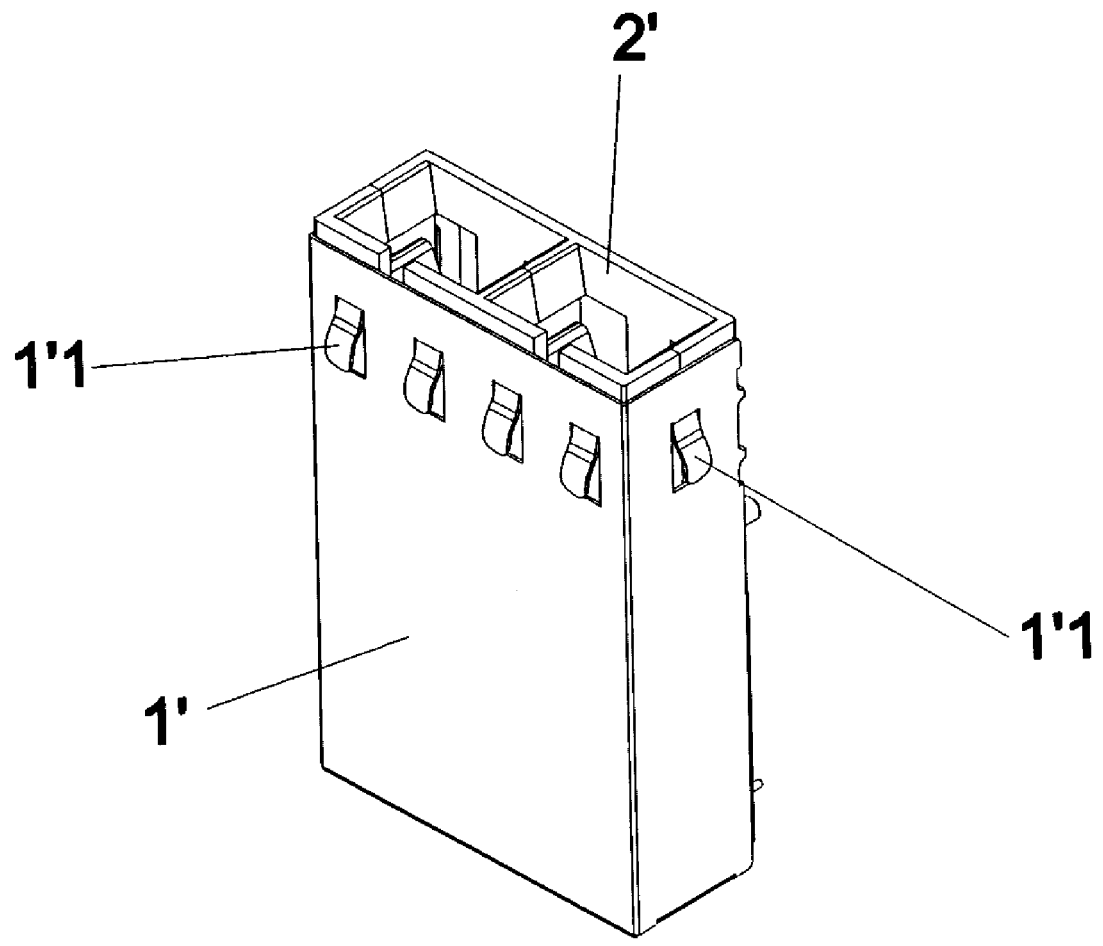
FIG. 12 is a top view of an embodiment of the invention when the rear, protruding casing is assembled to the photoelectric converter.

As shown in FIGS. 7–12, the rear protruding casing 1' is shaped like a "U" figure. a combination of rear protruding press plates 1'1 is installed at the lower side of one end of the rear protruding casing 1', such as shown in FIG. 7. Another two rear protruding press plate 1'1 are respectively installed at two opposite sides of the rear protruding casing 1' adjacent to the combination of rear protruding press plates 1'1. Two snap plates 1'2 are respectively installed on two opposite sides of the rear protruding casing 1' adjacent to the aforementioned another two rear protruding press plate 1'1. The rear protruding press plates 1'1 described above are located below one end of the rear protruding casing 1'. Two side faces 1'2' of the rear protruding casing 1' is joined with a rear end face 13', such as shown in FIGS. 10 and 11, wherein, when the snap plate 1'2 at lower part of two opposite sides of the rear protruding casing 1' is pressed and folded down to the side faces 1'2', the casing 1' is joined with the photoelectric converter 2. By pulling up the snap plate 1'2, the casing 1' is disassembled from the photoelectric converter 2. FIG. 12 shows a second embodiment view of the rear protruding casing 1' and the photoelectric converter 2' in their assembled status. Two snap plates 1'2 extend from the side faces 1'2' in the direction perpendicular to the rear end face 13', and all the rear protruding press plate 1'1 are respectively located within and protrude inwards and downwards to the side faces 1'2' and inside the rear end face 13'.

Summing up, the present invention of anti-electromagnetic wave casing for photoelectric converter has the following characteristics:

1. Convenient assembly.
2. Easy disassembly.
3. Multiple uses.

Having satisfied the requirements for a patent right, this application for a patent is duly filed for the present invention of a type of anti-electromagnetic casing for the photoelectric converter.

What is claimed is:

1. An anti-electromagnetic wave casing for a photoelectric converter, comprising:
    a U-shaped front protruding casing, wherein said U-shaped front protruding casing is composed of two opposite side faces and a rear end face, said U-shaped front protruding casing having one end;
    a combination of first front protruding press plates, wherein said combination of first front protruding press plates is installed at said one end;
    two second front protruding press plates, wherein said second front protruding press plates are respectively installed at one end of said side faces adjacent to said first front protruding press plates; and
    a plurality of snap plates, wherein said snap plates are respectively installed at said one end of said side faces adjacent to said second front protruding press plates, and extend from said side faces in the direction perpendicular to said rear end face, and said U-shaped front protruding casing is designed to be fitted with said photoelectric converter, and, when said snap plates are pressed and folded down to said side faces, said U-shaped front protruding casing is joined with said photoelectric converter, and, when said snap plates are pulled up, said U-shaped front protruding casing is disassembled from said photoelectric converter;
    wherein said first front protruding press plates and said second front protruding press plates protrude respectively outwards and upwards from said side faces and said rear end face.

2. An anti-electromagnetic wave casing for a photoelectric converter, comprising:
    a U-shaped rear protruding casing, wherein said U-shaped rear protruding casing is composed of two opposite side faces and a rear end face, said U-shaped rear protruding casing having one end;
    a combination of first rear protruding press plates, wherein said combination of first rear protruding press plates is installed at said one end;
    two second rear protruding press plates, wherein said second rear protruding press plates are respectively installed at one end of said side faces adjacent to said first rear protruding press plates; and
    a plurality of snap plates, wherein said snap plates are respectively installed at said one end of said side faces adjacent to said second rear protruding press plates, and extend from said side faces in the direction perpendicular to said rear end face, and said U-shaped rear protruding casing is designed to be fitted with said photoelectric converter, and, when said snap plates are pressed and folded down to said side faces, said U-shaped rear protruding casing is joined with said photoelectric converter, and, when said snap plates are pulled up, said U-shaped rear protruding casing is disassembled from said photoelectric converter;
    wherein said first rear protruding press plates and said second rear protruding press plates are located within and protrude downwards and inwards to said side faces and said rear end face.

* * * * *